(12) United States Patent
Montgomery et al.

(10) Patent No.: US 6,445,187 B1
(45) Date of Patent: Sep. 3, 2002

(54) SYSTEM FOR THE MEASUREMENT OF ELECTRICAL CHARACTERISTICS OF GEOLOGICAL FORMATIONS FROM WITHIN STEEL CASED WELLS USING MAGNETIC CIRCUITS

(76) Inventors: Jerry R. Montgomery, 4738 W. Harman Dr., West Valley City, UT (US) 84120; Sarah Elle Montgomery, 52 N. D St., Salt Lake City, UT (US) 84103; Nathan Rich Montgomery, 601 Emerald, Kemmerer, WY (US) 83101

( * ) Notice: Subject to any disclaimer, the term of this patent is extended or adjusted under 35 U.S.C. 154(b) by 0 days.

(21) Appl. No.: 09/545,824

(22) Filed: Apr. 10, 2000

(51) Int. Cl.⁷ .................................................. G01V 3/08
(52) U.S. Cl. ........................ 324/346; 324/368; 324/244
(58) Field of Search ................................ 324/338, 339, 324/351, 352, 368, 244, 346; 236/93 R

(56) References Cited

U.S. PATENT DOCUMENTS

| | | | |
|---|---|---|---|
| 3,980,881 A | 9/1976 | Veach et al. ................. 250/26 |
| 3,982,176 A | 9/1976 | Meador ......................... 324/6 |
| 4,071,815 A | 1/1978 | Zemanek, Jr. ................. 324/8 |
| 4,100,483 A | 7/1978 | Thompson et al. ............ 324/6 |
| 4,110,682 A | 8/1978 | Tabanou ...................... 324/10 |
| 4,117,394 A | 9/1978 | Souhaite ...................... 324/10 |
| 4,125,221 A | * 11/1978 | Carlson .................... 236/93 R |
| 4,130,793 A | 12/1978 | Bridges et al. ................ 324/6 |
| 4,205,288 A | 5/1980 | Lin et al. ...................... 336/5 |
| 4,319,191 A | 3/1982 | Meador et al. ............. 324/341 |
| 4,320,340 A | 3/1982 | Lichtenberg ................ 324/221 |
| 4,323,848 A | 4/1982 | Kuckes ....................... 324/338 |
| 4,334,205 A | 6/1982 | Seilly ........................ 335/220 |
| 4,359,687 A | 11/1982 | Vinegar et al. ............. 324/366 |
| 4,361,808 A | 11/1982 | Kern et al. ................. 324/366 |
| 4,435,977 A | 3/1984 | Gournay ...................... 73/152 |
| 4,456,898 A | 6/1984 | Frischmann ................ 335/217 |
| 4,499,422 A | 2/1985 | Sinclair ....................... 324/339 |
| 4,502,010 A | 2/1985 | Kuckes ........................ 324/338 |
| 4,524,272 A | 6/1985 | Paap et al. ................... 250/265 |
| 4,528,508 A | 7/1985 | Vail, III ...................... 324/303 |
| 4,553,097 A | 11/1985 | Clark .......................... 324/338 |
| 4,560,663 A | 12/1985 | Nicksic et al. ................ 436/25 |
| 4,609,873 A | 9/1986 | Cox et al. .................... 324/338 |
| 4,631,604 A | 12/1986 | Randall ....................... 360/66 |
| 4,652,828 A | 3/1987 | Kenyon et al. ............. 324/338 |
| 4,656,422 A | 4/1987 | Vail, III et al. ............. 324/303 |
| 4,692,706 A | 9/1987 | Mazzagatti et al. ......... 324/338 |
| 4,697,150 A | 9/1987 | Marquis ...................... 324/373 |
| 4,748,415 A | 5/1988 | Vail, III ...................... 324/339 |
| 4,792,757 A | 12/1988 | Vail, III et al. ............. 324/303 |
| 4,820,989 A | 4/1989 | Vail, III ...................... 324/368 |
| 4,882,542 A | 11/1989 | Vail, III ...................... 324/368 |
| 4,897,605 A | 1/1990 | Cox et al. .................... 324/341 |
| 4,899,112 A | 2/1990 | Clark et al. ................. 324/338 |
| 4,901,023 A | 2/1990 | Vail, III ...................... 324/339 |
| 4,933,638 A | 6/1990 | Kenyon et al. ............. 324/303 |
| 4,933,640 A | 6/1990 | Kuckes ........................ 324/339 |
| 4,947,119 A | 8/1990 | Ugurbil et al. ............. 324/307 |
| 5,014,006 A | 5/1991 | Seitz .......................... 324/249 |
| 5,038,107 A | 8/1991 | Gianzero et al. ........... 324/339 |
| 5,043,668 A | 8/1991 | Vail, III ...................... 324/368 |
| 5,043,669 A | 8/1991 | Vail, III ...................... 324/368 |
| 5,055,787 A | 10/1991 | Kleinberg et al. .......... 324/303 |

(List continued on next page.)

Primary Examiner—Jay Patidar
(74) Attorney, Agent, or Firm—Lloyd W. Sadler

(57) ABSTRACT

A system for measuring magnetic fields outside a ferromagnetic container from inside the same container is described. The invention uses magneti circuits to direct the flow of magnetic flux to a magnetic field detector. By using magnetic fields for detection, this invention is able to measure the properties of magnetic materials outside the ferromagnetic container, such as a geologic formation, electric or magnetic parameters, or log well and drill holes that have been cased.

3 Claims, 12 Drawing Sheets

U.S. PATENT DOCUMENTS

| | | | |
|---|---|---|---|
| 5,055,788 A | 10/1991 | Kleinberg et al. | 324/303 |
| 5,065,100 A | 11/1991 | Vail, III | 324/339 |
| 5,136,453 A | 8/1992 | Oliver | 361/35 |
| 5,142,472 A | 8/1992 | Day | 364/422 |
| 5,159,347 A | 10/1992 | Osterwalder | 343/787 |
| 5,187,440 A | 2/1993 | Vail, III | 324/372 |
| 5,218,301 A | 6/1993 | Kuckes | 324/346 |
| 5,252,918 A | 10/1993 | VanBerg et al. | 324/207.19 |
| 5,260,661 A | 11/1993 | Vail, III | 324/339 |
| 5,260,662 A | 11/1993 | Rorden | 324/339 |
| 5,313,182 A | 5/1994 | Blache | 335/306 |
| 5,323,856 A | 6/1994 | Davis et al. | 166/253 |
| 5,359,324 A | 10/1994 | Clark et al. | 340/854.3 |
| 5,426,367 A | 6/1995 | Martin et al. | 324/339 |
| 5,444,619 A | 8/1995 | Hoskins et al. | 364/421 |
| 5,453,693 A | 9/1995 | Sinclair et al. | 324/324 |
| 5,467,769 A | 11/1995 | Yoshino et al. | 128/653.2 |
| 5,495,169 A | 2/1996 | Smith | 324/127 |
| 5,497,321 A | 3/1996 | Ramakrishnan et al. | 364/422 |
| 5,498,960 A | 3/1996 | Vinegar et al. | 324/303 |
| 5,510,712 A | 4/1996 | Sezginer et al. | 324/368 |
| 5,557,200 A | 9/1996 | Coates | 324/303 |
| 5,563,514 A | 10/1996 | Moulin | 324/368 |
| 5,570,024 A | 10/1996 | Vail, III | 324/368 |
| 5,589,775 A | 12/1996 | Kuckes | 324/346 |
| 5,633,590 A | 5/1997 | Vail, III | 324/368 |
| 5,646,533 A | 7/1997 | Locatelli et al. | 324/339 |
| 5,650,726 A | 7/1997 | Gasnier et al. | 324/339 |
| 5,652,519 A | 7/1997 | Warren et al. | 324/339 |
| 5,781,436 A | 7/1998 | Forgang et al. | 364/422 |
| 5,798,679 A | 8/1998 | Pissanetzky | 335/299 |
| 5,809,458 A | 9/1998 | Tamarchenko | 702/9 |
| 5,814,988 A | 9/1998 | Itskovich et al. | 324/303 |
| 5,825,188 A | 10/1998 | Montgomery et al. | 324/357 |
| 5,831,433 A | 11/1998 | Sezginer et al. | 324/303 |
| 5,841,281 A | 11/1998 | Beard et al. | 324/339 |
| 5,859,533 A | 1/1999 | Gasnier et al. | 324/339 |
| 5,892,362 A | 4/1999 | Warren et al. | 324/339 |
| 5,900,733 A | 5/1999 | Wu et al. | 324/338 |

* cited by examiner

Electric Circuits
Parallel Circuits

Series Circuits

SYSTEM FOR THE MEASUREMENT OF ELECTRICAL CHARACTERISTICS OF GEOLOGICAL FORMATIONS FROM WITHIN STEEL CASED WELLS USING MAGNETIC CIRCUITS

BACKGROUND OF THE INVENTION

1. Field of the Invention

This invention relates to the measurement of magnetic fields. More specifically, this invention relates to the measurement of electrical characteristics of geological formations from within steel cased wells using magnetic circuits.

2. Description of Related Art

Recently the U.S. Department of Energy has sought research proposals on the development of technology to measure the magnetic fields that are outside a steel well casing from inside the steel well casing. A number of partial solutions have been proposed. Generally, these approaches have important limitations, these limitations include: the need for magnetically saturating the well casings, operating only within a few dozen hertz, relying on electromagnetic effects the saturation of the magnetic well casing, a magnetic focusing device, and passing an electromagnetic signal through a conductor, and do not address the use of magnetic sensors suitable for the measurement of the effects of magnetic signals with frequencies above 2 k Hz. Prior approaches also are limited by the electrical skin depth of the conductor, thus as the frequency increases the signal strength decreases. Nor do they use magnetic circuits to direct the magnetic flux directly to the magnetic sensor. Nevertheless, the reader is referred to the following U.S. patent documents for general background material. Each of these patents is hereby incorporated by reference in its entirety for the material contained therein.

U.S. Pat. No. 3,980,881 describes a well logging system of the type utilizing a single conductor cable to provide power from the surface equipment to a down hole subsurface unit and for simultaneously supplying current mode telemetry signals from one or more radiation detectors in the subsurface unit to the surface equipment.

U.S. Pat. No. 3,982,176 describes a well logging system that simultaneously employs a conventional deep induction log and a radio frequency dielectric log to differentiate similar high resistivity fresh water and oil prospective zones.

U.S. Pat. No. 4,071,815 describes a borehole tool for logging the remnant magnetic field of the earth formations surrounding a borehole that includes a coil system having a transmitter, receiver, and nulling coils, a phase-sensitive detector connected across the receiver and nulling coils and a detector system having a pair of axially spaced magnetometers, a pair of counters, an oscillator, a comparator, and a transmitter.

U.S. Pat. No. 4,100,483 describes a dielectric well logging system that includes a logging tool adapted to be passed through a borehole traversing an earth formation.

U.S. Pat. No. 4,110,682 describes a well logging apparatus that uses a narrow wall-engaging pad equipped with an array of vertical electrodes.

U.S. Pat. No. 4,117,394 describes a well logging apparatus that uses a narrow wall-engaging pad equipped with an array of long vertical electrodes.

U.S. Pat. No. 4,130,793 describes a dielectric well logging means that utilizes the signals from a pair of receivers for providing clock pulses corresponding to earth formation dielectric constant.

U.S. Pat. No. 4,205,288 describes an electrical transformer having an electrical winding and a magnetic core having two parallel magnetic circuits having unequal mean lengths.

U.S. Pat. No. 4,319,191 describes a dielectric well logging system that has its coils aligned radially, rather than in alignment, with respect to the longitudinal axis of a sonde, which moves a coil through a borehole.

U.S. Pat. No. 4,320,340 describes a well logging method and apparatus that measures the density of the flux field established inside the casing due to galvanic current flow longitudinally within the casing.

U.S. Pat. No. 4,323,848 describes a method of well logging in petroleum exploration, where a magnetometer is disposed in a well bore to provide indications of the distribution, filimentation, and distortion of a controlled current flow within adjoining strata of interest.

U.S. Pat. No. 4,334,205 describes an electromagnetic device that comprises an annular armature, an inner stator structure defining outwardly extending pole pieces and an outer stator structure defining inwardly extending pole pieces.

U.S. Pat. No. 4,359,687 describes an apparatus for borehole measurements of the induced polarization of earth formations.

U.S. Pat. No. 4,361,808 describes methods and systems for measuring the dielectric constant of an earth formation.

U.S. Pat. No. 4,435,977 describes a method of identifying potential low water cut hydrocarbon producing zones in a sand or sandstone formation by logging the formation to determine its permeability and porosity values and generating from said two sets of values a log of specific surface areas of the formation.

U.S. Pat. No. 4,456,898 describes thermal compensators that comprise at least one metallic alloy in amorphous form, which are especially useful in stabilizing magnetic devices under conditions of changing ambient operating temperature.

U.S. Pat. No. 4,499,422 describes a digital induction resistivity-logging tool for digitally measuring both the in-phase and the quadrature phase components in a receiver signal generated in response to induce eddy currents flowing in the earth's sub-surface formations.

U.S. Pat. No. 4,502,010 describes a method of well logging in petroleum exploration and apparatus for use in the method.

U.S. Pat. No. 4,524,272 describes a method for measuring the location, linear.

flow rate and volume flow rate of undesired water flow behind well casing in a well, that includes irradiating borehole environs with high energy neutrons from a neutron source located in a well tool in the borehole.

U.S. Pat. No. 4,528,508 describes a method and apparatus, which allows remote sensing and in-situ volumetric measurement of liquid petroleum reserves.

U.S. Pat. No. 4,553,097 describes a well logging apparatus and method which can be used as a wireline logging device or technique, and is also suitable for being employed in a logging-while-drilling device.

U.S. Pat. No. 4,560,663 describes a well logging method for identifying the presence of crude petroleum within subsurface earth formations by detecting electron spin resonance signals along a well bore and identifying crude petroleum as the source of those signals by enhancing and/or suppressing the signal by the presence of a chemical.

U.S. Pat. No. 4,609,873 describes a dielectric well logging system that determines dielectric constant and resistivity in formations invaded by water to determine oil and water saturation of the formations.

U.S. Pat. No. 4,631,604 describes a magnetic circuit that is biased by applying signals having noise-like properties to the magnetic circuit.

U.S. Pat. No. 4,652,828 describes well logging techniques for obtaining improved measurements of formation dielectric permitivity, conductivity, and water-filled porosity.

U.S. Pat. Nos. 4,656,422 and 4,792,757 describe oil well logging tools, which make use of nucleons, which are chemically bound to oil and water in geological formations that possess magnetic moments, which align in the earth's magnetic field causing the natural nuclear paramagnetism of the formation.

U.S. Pat. No. 4,692,706 describes a method and apparatus for determining the water saturation of a petroleum reservoir earth formation that includes transmitting electromagnetic energy in the earth formation from within a borehole traversing the earth formation and at least two frequencies within a preferred range of frequencies.

U.S. Pat. No. 4,697,150 describes a well logging instrument for measuring the resistivity of relatively thin formation beds.

U.S. Pat. No. 4,748,415 describes methods and apparatus, which allow induction logging of geological formation through borehole casing.

U.S. Pat. No. 4,820,989 describes methods and apparatus which allow measurement of the resistivity of a geological formation through borehole casing that may be surrounded by brine saturated cement.

U.S. Pat. No. 4,882,542 describes methods and apparatus for measuring electronic properties of geological formations and cement layers adjacent to cased boreholes, including resistivities, polarization phenomena and dielectric constants.

U.S. Pat. No. 4,897,605 describes a well logging system and method that determines the dielectric constant and/or conductivity of earth formations some of which have fluid invasion.

U.S. Pat. No. 4,899,112 describes well logging techniques and apparatus for determining formation resistivity at different radial depths of investigation for determining the existence, locations and properties of beds and caves, and for determining changes in the size of a borehole.

U.S. Pat. No. 4,901,023 describes methods and apparatus for the measurement of the longitudinal components of low frequency A.C. magnetic fields from within cased boreholes, which are used to measure the geophysical properties of geological formations.

U.S. Pat. No. 4,933,638 describes borehole NMR logging apparatus and methods and methods for the interpretation thereof.

U.S. Pat. No. 4,933,640 describes a method and apparatus for determining the distance and direction of a well from a borehole.

U.S. Pat. No. 4,947,119 describes several magnetic resonance imaging methods using adiabatic excitation.

U.S. Pat. No. 5,014,006 describes a device for measuring a weak magnetic field.

U.S. Pat. No. 5,038,107 describes a method and apparatus for making high resolution induction measurements through borehole casing by magnetically saturating the casing.

U.S. Pat. Nos. 5,043,668 and 5,043,669 describe methods and apparatus for measuring electronic properties of geological formations and cement layers adjacent to cased boreholes that includes resistivities, polarization phenomena and dielectric constants.

U.S. Pat. Nos. 5,055,787 and 5,055,788 describe borehole NMR logging apparatus and methods and methods for the interpretation thereof.

U.S. Pat. No. 5,065,100 describes a method for the measurement of the longitudinal components of low frequency A.C. magnetic fields from within cased boreholes that are used to measure the geophysical properties of geological formations.

U.S. Pat. No. 5,136,453 describes a method for suppressing geomagnetically induced currents.

U.S. Pat. No. 5,142,472 describes a method for determining true in-situ resistivity of a thin layer within a formation from dual induction log data.

U.S. Pat. No. 5,159,347 describes microscopic strips of high permeability magnetic conductor that are arrayed in a proximate relation to an electrical conductor to form paths for magnetic circuits about the electrical conductor.

U.S. Pat. No. 5,187,440 describes a method for measuring resistivity changes within a cased well by conducting A.C. current through geological formation separating two cased wells in an oil field undergoing enhanced oil recovery operations such as water flooding operations.

U.S. Pat. No. 5,218,301 describes a method and apparatus for determining the distance from a relief borehole to a target well that utilizes measurements of an electric field at the target well.

U.S. Pat. No. 5,252,918 describes plug released into an oil or gas well that carries one or more metallic strips that affect the inductance of a resistive-inductive bridge circuit mounted adjacent a conduit through which the plug and fluids are pumped into the well.

U.S. Pat. No. 5,260,661 describes a method for the measurement of the longitudinal components of low frequency A.C. magnetic fields from within cased boreholes.

U.S. Pat. No. 5,260,662 describes a method and apparatus that relies on a modified induction approach and that is preferably incorporated into a metal drill collar for MWD measurements.

U.S. Pat. No. 5,313,182 describes a magnet structure for a displacement sensor.

U.S. Pat. No. 5,323,856 describes a system for sensing the passage of a member past a predetermined location along tubing disposed in an oil or gas well.

U.S. Pat. No. 5,359,324 describes a logging-while-drilling system for investigating earth formations.

U.S. Pat. No. 5,426,367 describes a well logging method and apparatus that provides a magnetic saturation signal to at least a transmitter and one receiver mounted in a well casing of a well so as to open "windows" in the casing to allow the impedances of the formations outside the casing to be logged and recorded and also to detect faults in the casing.

U.S. Pat. No. 5,444,619 describes a system and method for predicting oil reservoir properties throughout the reservoir using well data and seismic data.

U.S. Pat. No. 5,453,693 describes a system for measuring dielectric properties of fluids in an oil well, that utilizes the well casing as a waveguide for certain electromagnetic signals.

U.S. Pat. No. 5,467,769 describes a magnetic field generating apparatus that has a permanent magnet arrangement for generating a magnetic field in a magnetic field generating space and a yoke arrangement for forming magnetic circuits for generation of the magnetic field together with the permanent magnet arrangement.

U.S. Pat. No. 5,495,169 describes a clamp-on magnetic sensor that includes a U-bar first magnetic core section and a straight magnetic core section that integrally fit together so that the straight magnetic core section is held in place by the U-bar.

U.S. Pat. No. 5,497,321 describes a logging tool that provides a log of fractional flow characteristics of formations surrounding an earth borehole.

U.S. Pat. No. 5,498,960 describes a lithology-independent method of well logging the gas saturation in a reservoir containing natural gas.

U.S. Pat. No. 5,510,712 describes a method of determining the resistivity of an underground formation surrounding a cased borehole.

U.S. Pat. No. 5,563,514 describes a method of determining the resistivity of a geological formation through which a metal-cased borehole passes, by means of at least three electrodes in contact with the casing and spaced apart in the longitudinal direction of the borehole.

U.S. Pat. No. 5,570,024 describes methods for determining resistivity of a formation adjacent to a borehole having a casing that uses multiple electrodes and with resistances defined between the electrodes.

U.S. Pat. No. 5,557,200 describes a system for using magnetic resonance techniques to obtain information relating to geologic structures.

U.S. Pat. No. 5,589,775 describes a method for determining the distance and direction from a first borehole to a second borehole that includes generating an elliptically polarized magnetic field in the region of the first borehole.

U.S. Pat. No. 5,633,590 describes the methods for quantitatively determining the separate amounts of oil and gas in a geological formation adjacent to a cased well using measurements of formation resistivity.

U.S. Pat. No. 5,646,533 describes a device for induction measurement of a medium adjacent to a cylindrical, metallic, magnetic walled well of a well casing that includes at least two magnetic circuits for magnetically saturating the metallic wall.

U.S. Pat. No. 5,650,726 describes an emitter for a system for electromagnetic tomographic measurement.

U.S. Pat. No. 5,652,519 describes methods and apparatus for measuring pollutants contaminating earth formation.

U.S. Pat. No. 5,781,436 describes a method of measuring the conductivity of earth formations penetrated by a wellbore.

U.S. Pat. No. 5,798,679 describes an apparatus and method for bending magnetic flux in a magnetic circuit.

U.S. Pat. No. 5,809,458 describes a method of simulating response of a through casing electrical resistivity well logging instrument to a set of simulated earth formations, cement and casing.

U.S. Pat. No. 5,814,988 describes an apparatus for measuring induction resistivity and nuclear magnetic resonance properties of earth formations penetrated by a wellbore.

U.S. Pat. No. 5,825,188 describes an electromagnetic method that can be used to map, track, and monitor subsurface water or solutions and related geologic structure.

U.S. Pat. No. 5,831,433 describes a method for determining a nuclear magnetic resonance characteristic and the resistivity of earth formations surrounding a borehole U.S. Pat. No. 5,841,281 describes a method of determining the conductivity of earth formations penetrated by a wellbore.

U.S. Pat. No. 5,859,533 describes an emitter for a system of electromagnetic tomographic measurements.

U.S. Pat. No. 5,892,362 describes a method and apparatus for using service induction techniques to produce two-dimensional spatially continuous imaging of subsurface conditions for interpreting and verifying three-dimensional, spatially continuous imaging of subsurface conditions.

U.S. Pat. No. 5,900,733 describes a well logging method and apparatus for determining borehole corrected formation resistivity, borehole diameter, and downhole borehole fluid resistivity.

SUMMARY OF THE INVENTION

It is desirable to provide a system and method for measuring the electrical and magnetic characteristics of geologic formations outside a case well from the inside of the case well using magnetic fields. It is especially desirable to provide such a system and method that provides improved information quality by measuring the characteristics at high frequencies. Moreover, it is desirable to use magnetic circuits to direct and control the flow of magnetic flux in magnetic materials to detectors to measure the magnet field through ferromagnetic materials that compose a well casing and to thereby determine the properties of materials outside the well casing beyond the ferromagnetic materials.

Accordingly, it is the primary object of this invention to provide a method and system for measuring the properties of geologic formations outside a case well from inside the case well using magnetic fields.

Another object of this invention is to provide a method and system for logging a well, after its production has diminished or has ended, in order to determine if any other strata or formation at another depth may have missed oil or gas.

A further object of this invention is to provide a method and system for measuring the properties of geologic formations by using magnetic circuits to tap a portion of the magnetic flux flowing in the well casing.

A still further object of this invention is to provide a method and system for measuring the properties of geologic formations that creates a magnetic short circuit by making magnetic contact with a well casing using high permeability ferromagnetic materials.

It is another object of this invention to provide a method and system for measuring the properties of geologic formations by using a magnetic short to channel a portion of magnetic flux through a high permeable material to a magnetic flux detector.

Additional objects, advantages and other novel features of this invention will be set forth in part in the description that follows and in part will be apparent to those skilled in the art upon examination of the following or may be learned with the practice of the invention. The objects and advantages of this invention may be realized and attained by means of the instrumentalties and combinations particularly pointed out in the appended claims. Still other objects of the present invention will become readily apparent to those skilled in the art from the following description wherein there is shown and described the preferred embodiment of this invention, simply by way of illustration of one of the modes best suited to carry out this invention. As it will be realized, this invention is capable of other different embodiments, and its several details and specific circuits are capable of modification in various aspects without departing from the invention. Accordingly, the drawings and descriptions that follow should be regarded as illustrative in nature and not as restrictive.

To achieve the foregoing and other objects, and in accordance with the purposes of the present invention, a magnetic circuit is provided which employs a pipe with a high permeable shunt, a magnetic flux detector, and an electric current generator.

BRIEF DESCRIPTION OF THE DRAWINGS

The accompanying drawings incorporated in and forming a part of the specification, illustrate a preferred embodiment of the present invention. Some, although not all, alternative embodiments are described in the following description. In the drawings.

Figure 1A:
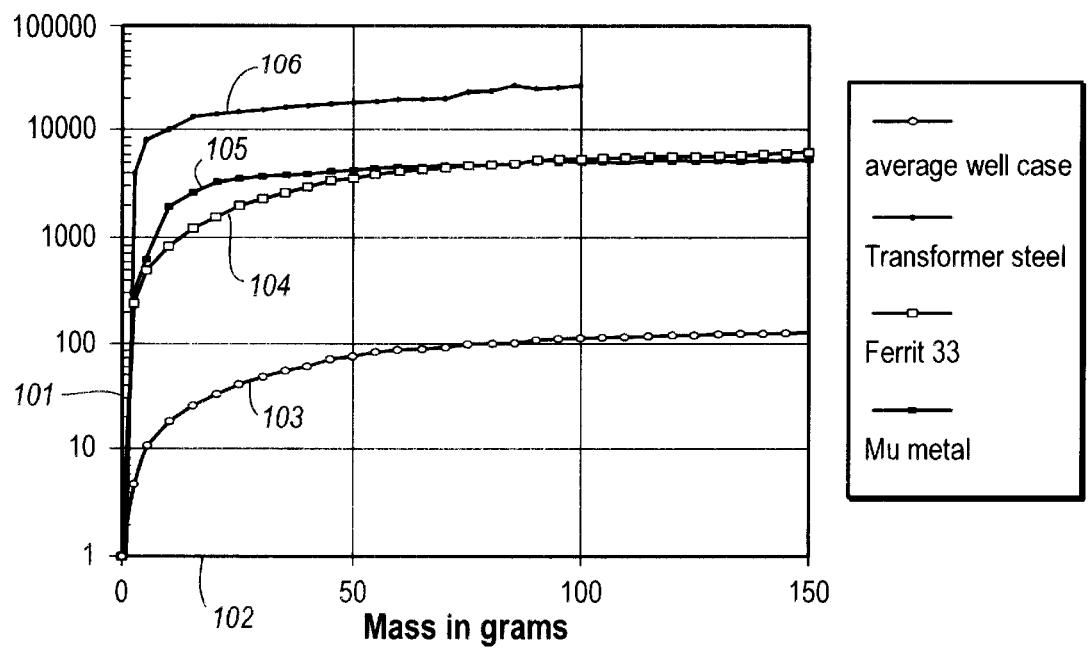
FIG. 1a is a chart showing the relative permeability of various magnetic materials used in magnetic circuits.

Reference will now be made in detail to the present preferred embodiment and the alternative embodiments of the invention, examples of which are illustrated in the accompanying drawings.

DETAILED DESCRIPTION OF THE INVENTION

This invention is a method and system for the measurement of magnetic fields outside a ferromagnetic container or enclosure. In particular, this invention makes use of sensors which measure magnetic fields and/or magnetic signal effects at relatively high frequencies that is approximately 2 k hertz or greater. By making use of the magnetic flux in a magnetic medium, this invention is capable of measuring signals at these relatively high frequencies and, therefore, is capable of acquiring greater quantities and quality of information from the signal. The use of higher frequencies for measuring is also advantageous, because such techniques increase the sensitivity of the resistivity measurement of the formations that can be measured. For example, it is well known that for a typical induction-measuring tool to work, it must operate at frequencies above 10 k hertz. But, even at a frequency of 10 k hertz, the formation resistivity must be less than 100 ohm meters for the induction log to work adequately. At measurement frequencies below 2 k hertz, to respond the formation is limited to a sulfide ore body or must contain concentrated brine. (See Chapter II—Electrical Well Logging, Part 14—Induction Logging of *Electrical Methods in Geophysical Prospecting*, by George V. Keller and Frank C. Frischknecht, Pergamon Press, N.Y.)

The response of an induction tool is linearly related to the conductivity of the adjacent formation. This response is also proportional to several electrical and magnetic factors, including the following: First, the strength of the magnetic signal reaching the conductor. Second, the strength of the electrical current generated in the conductors that create the secondary magnetic field. Third, the strength of the secondary magnetic field that is returned to the sensor. It has been both theoretically and experimentally determined that the returned field strength is approximately equal to the fifth or sixth power of the distance between the sender and the target. Since a well casing adjacent to the sending coils is much more conductive that the surrounding formation, the signals from the casing will dominate signals from the formation outside the casing. As prior known technologies rely on the electromagnetic effect to penetrate the well casing, the large signal generated by the casing and the electromagnetic skin effect make measurement of the formation outside the casing very difficult. Moreover, electromagnetic "skin depth" δ is given by the following equation:

$$\delta = [2/(\omega\sigma\mu)^{1/2}]$$

Where
  ω is frequency times two pi (2πf)
  σ is conductivity or the inverse of resistivity (1/ρ) of the well casing
  μ is magnetic permeability of the well casing. (See Introduction to *Electromagnetic Fields and Waves*, by Corson & Lorrain, W. H. Freenam and Co.).

When electromagnetic signals are used, the field is damped exponentially with the skin depth. Typical steel well casings have conductivity on the order of about $10^7$ mhometers, and a permeability of about 100 to 500 gausses. Using these typical values, the skin depth of a steel well casing at 2 hertz is about 7 mm or about ⅜ of an inch, which is about the average thickness of the typical well casing. In sum, the prior techniques, which employ electromagnetic signals, limit the depth that a signal can penetrate a conductor. Basic electromagnetic theory states that there is a skin depth beyond which little or no electromagnetic signal penetrates in a conductor. While this theory is generally accepted as true for electromagnetic signals it is not true for only the magnetic signals.

This invention makes use of magnetic circuits to control the flow of magnetic flux and signals in magnetic materials. Magnetic circuits have previously been used in a variety of applications, including but not limited to the storage of information on magnetic medium, power transformers, electric motors and high-energy particle accelerators. However, this invention uses magnetic circuits to direct magnetic flux to detectors that are used to measure the magnetic field through the ferromagnetic materials that compose a well casing, and to thereby determine the properties of materials outside the well casing, beyond the ferromagnetic material.

For the purposes of this disclosure, by way of definition, the inventors define the following analogies between electrical properties and magnetic properties. Magnetic flux ($\phi$) is to magnetism as current (I) is to electricity; reluctance (R) is to magnetism as resistivity (R) is to electricity; magnetomotive force (mmf) is to magnetism as electromotive force (E volts) is to electricity; permeability ($\mu$) is to magnetism as susceptibility ($\epsilon$) is to electricity. Permeability and susceptibility represent the properties that interrelate electromagnetism, electricity and magnetism. Permeability, $\mu$, is the measure of how permeable matter or space is to a magnetic field. Susceptibility, $\epsilon$, is the measure of how susceptible matter or space is to an electrical field. The speed of light, c, is a property of matter related to electromagnetism. The speed of light squared is one over the product of permeability times susceptibility, ($c^2=1/(\epsilon_0\mu_0)$). This equation for the speed of light is for a vacuum or empty space. The speed of light in matter is slower because either or both $\epsilon$ and $\mu$ are larger in matter than in empty space.

Just as with electricity, there is an Ohms law for magnetism. This similarity between electricity and magnetism is exploited for this invention.

For electricity: E=I×R. while for magnetism mmf=$\phi$×R.

The force (F) exerted by an electric field: $F=(\frac{1}{4}\pi\epsilon)\times(q_1 q_0/r^2)$, while for magnetism: $F=(1/\mu)\times(m_1 m_0/r^2)$.

The resistance for electricity and the reluctance for magnetism are described as a constant time the length divided by the cross-sectional area.

For electricity: R=($\rho$×L)/A

For magnetism: R=1/($\mu$×A)

The constants are defined as follows. $\rho$ is resistivity. 1/$\rho$×$\sigma$ or conductivity. Note that $\sigma$ is to electricity as $\mu$ is to magnetism. However, as noted above, $\epsilon$ is related to the electrical field as $\mu$ is to magnetic fields. $\mu$ plays a dual roll in the behavior of magnetism, that is as related to conductivity and to susceptibility. This important difference between electricity and magnetism is exploited by this invention.

Also important for this invention is the similarity between electricity and magnetism in series and parallel circuits.

For a series circuits:

For electricity: $R_t=R_1+R_2$

For magnetism: $R_t=R_1+R_2$

For parallel circuits:

For electricity: $1/R_t=1/R_1+1/R_2$

For magnetism: $1/R_t=1/R_1+1/R_2$

Another important difference in electrical and magnetic properties of matter is that the electrical properties are linear while the magnetic properties are non-linear. This non-linearity of magnetic properties results in a phenomenon known as magnetic hysteresis. This invention exploits this difference between electricity and magnetism.

A still further difference between electrical properties and magnetic properties in a material is the response to excessive current or flux. In an electric circuit when the amount of current exceeds the capacity of the conductor, the conductor heats up until the circuit is destroyed. In a magnetic circuit when the magnetic flux capacity of the material is reached, no additional flux will flow in the material, even if the magnetic field is increased. This feature of magnetism is exploited by this invention.

Magnetic flux flows through different materials in much the same manner that electric current flows through different materials. But while electric current is limited by the resistivity or conductivity of the material, magnetic flux is limited by reluctance or permeability. Based on this relationship and the fact that magnetic fields are separate from electromagnetic fields, leads one to the conclusion that a magnetic circuit can be constructed without the skin depth limitations of electromagnetic fields.

As with an electrical field, a magnetic field can be used to transmit a signal or have a measurable effect at a distance. By way of introduction, electrons in a ferromagnetic material must be in motion to create a magnetic field. A magnetic flux can propagate without electron motion but is enhanced by the alignment of electrons in highly permeable matter, such as ferromagnetic material. Magnetic fields propagate at the speed of light. However, both electric and magnetic fields, when existing alone, do not have to move in space. Rather a standing or static field can be established. Nevertheless, the effects of the electric and magnetic field travels at approximately the speed of light. When the electric and magnetic fields combine to create an electromagnetic field, the resulting field and its effect travel at approximately the speed of light.

Electromagnetic signals are result of an accelerating electrical charge, and when transmitted is a combination of both an electrical field and a magnetic field vibrating at right angles to each other and both at right angles to the direction of wave propagation. Accepted theory and experience demonstrate that the penetration of an electromagnetic signal is proportional to the conductivity of the material being impinged upon by the electromagnetic signal.

This invention uses magnetism and not electromagnetics to detect a magnetic field that is outside of an iron pipe or casing from inside of the pipe or casing and to thereby measure and test materials through the ferromagnetic materials of well casings. In essence, this invention uses magnetic circuits to control the flow of magnetic flux and thus direct that flux so that it can be measured or used to create the desired field that can ultimately be measured. This invention uses the magnetic circuit to tap a portion of the magnetic flux flowing in the well casing. A magnetic short circuit is created, by making magnetic contact with the well casing using high permeability ferromagnetic materials. This magnetic short circuit channels a portion of the magnetic flux through the high permeability material to a magnetic flux detector. Since both the well casing and the magnetic shunt are ferromagnetic materials, both materials tend to behave as a parallel circuit. Each parallel arm of the circuit carries a proportional amount of the magnetic flux based on the reluctance of each arm of the circuit. The amount of magnetic flux in the shunt is generally the same ratio along a uniform well casing. Additional magnetic circuits can optionally be used to measure any inconsistency in the well casing thickness so that necessary corrections can be made.

A number of variations in the arrangements in the magnetic circuits can be employed to determine particular formation parameters. Two parallel magnetic circuits can be used, one transmitting a signal and the other receiving the resulting signal. Alternatively, a series magnetic circuit can also be used. Combination circuits can be used where the receiver is a magnetic circuit and the transmitter is an electric circuit. Electricity flowing in the ground from an electrical transmitter will create a magnetic field that surrounds the flow of electricity through a conductor. As noted above a variety of different circuit arrangements can be designed to apply the principle of using magnetic circuits to control the flow of magnetic flux in and around a steel well casing. Similarly a number of different devices can be used to measure magnetic fields, including but not limited to Flux-gate magnetometers, Hall effect devices, Josephson Junctions (squibs) or simply coils of conductive wire. The particular measuring device is not critical to this invention. Rather the use of magnetic circuits to direct the flow of magnetic flux to the measuring device is critical to this. invention. The preferred detector is a highly sensitive coil made of a ferrite material. Some preferred coil materials include but are not limited to as follows: cold rolled steel, iron, purified iron, 4% silicon-iron grain oriented, 45 permalloy, hipernik, monimax, sinimax, 78 permalloy, 4–79 permalloy, mu metal, supermalloy, permendu, 2V permendur, cabonyl iron and ferroxcub III. These magnetic circuits are used to control and direct the flow of magnetic flux to the desired measuring location. This controlled and directed magnetic flux can then be measured. This principle of magnetic circuits is used to create a directed magnetic field that can ultimately be used to measure the properties of nearby matter.

Two preferred processes for performing this invention are: first, for continuous readings lowering a probe slowly into the well while a digital or chart record is obtained on the surface; and, second, for discontinuous readings, lowering a probe to a discrete level in the well, taking a reading at that discrete level, repositioning the probe to another level and taking a reading, repeating this second process for as many discontinuous measurements as are desired.

The current preferred embodiments are detailed and described as follows.

FIG. 1a shows a chart showing the relative permeability of various magnetic materials used in magnetic circuits. The permeability is shown on the vertical axis 101, while the material mass in grams is shown on the horizontal axis 102. The relative permeability of four materials is shown. The permeability of Mu metal is shown in the first curve 103. The permeability of Ferrit 33 metal is shown in the second curve 104. The permeability of typical transformer steel is shown in the third curve 105. The permeability of an average well case is shown in the fourth curve 106. This chart shows that different materials carry different quantities of magnetic flux. The average well casing steel 106 magnetic flux capabilities shown relative to that of transformer steel 105, ferrit 104, Mu metal 103 or other similar high permeability materials. This figure also demonstrates that the greater the mass of the material the more magnetic flux that the material can carry. This relationship between mass and flux is not linear.

Figure 1B:
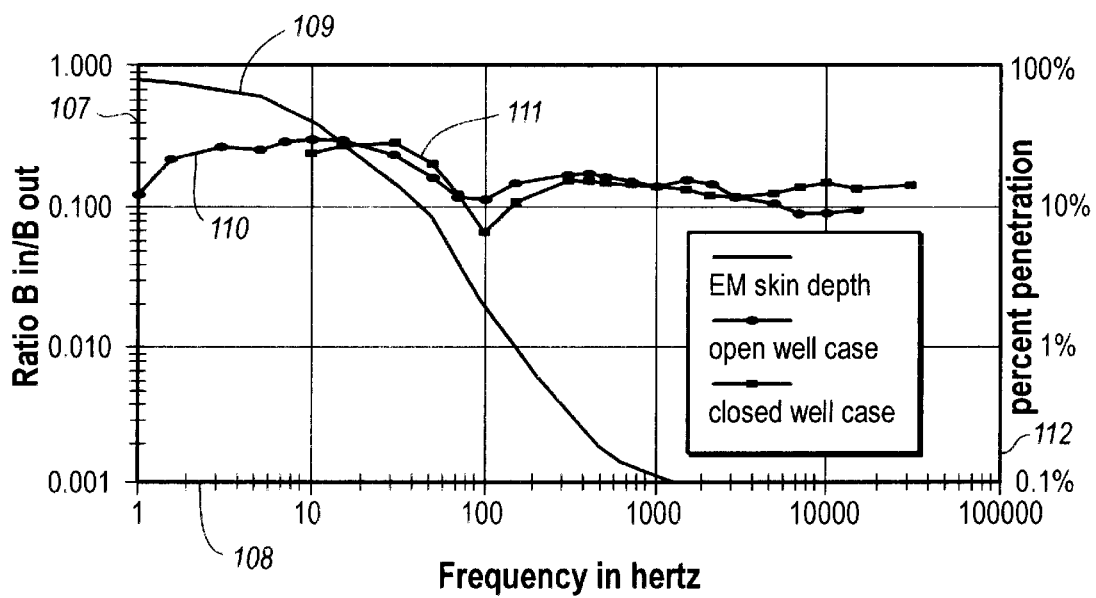
FIG. 1b is a chart showing the percentage of the magnetic field penetrating the well casing.

FIG. 1b is a chart showing the percentage of the magnetic field penetrating the well casing. The first vertical axis 107 is the ratio of magnetic field produced to magnetic field measured. The horizontal axis 108 is frequency in hertz. The second vertical axis 112 is the percent of penetration of the magnetic field. The electromagnetic skin depth is shown in curve 109. The open well case magnetic field measurements are shown in curve 110. The closed well case magnetic field measurements are shown in curve 111. These curves 109, 110, 111 are made by creating a magnetic short circuit across the well casing thereby channeling a portion of the magnetic flux through the short. This graph represents the percentage of the magnetic signal following the short relative to the total magnetic field that is creating the magnetic flux in the well casing. For example, at 10 hertz about 30 percent of the signal is following the shunt or magnetic short circuit in an open well case. This percentage slowly decreases to about 10 percent at $10^5$ hertz. This decrease in penetration percentage 112 is due to the magnetic effects of frequency on magnetic saturation, and is not caused by the electromagnetic (EM) skin effect 109.

Figure 2A:
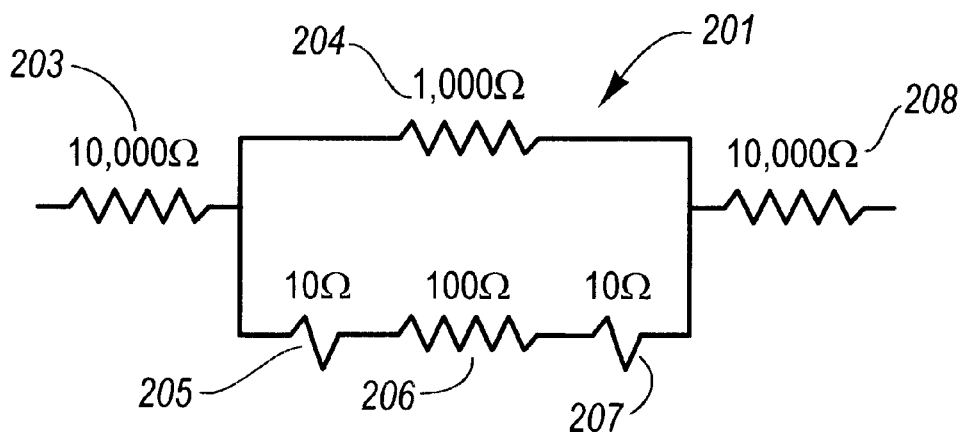
FIGS. 2a 2b are diagram showing equivalent electric and magnetic circuits.
Figure 2A:
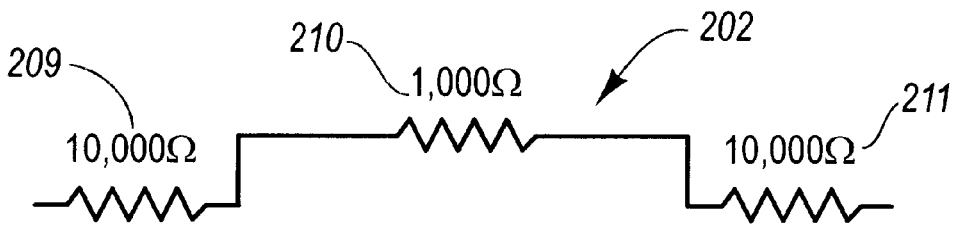
Figure 2B:
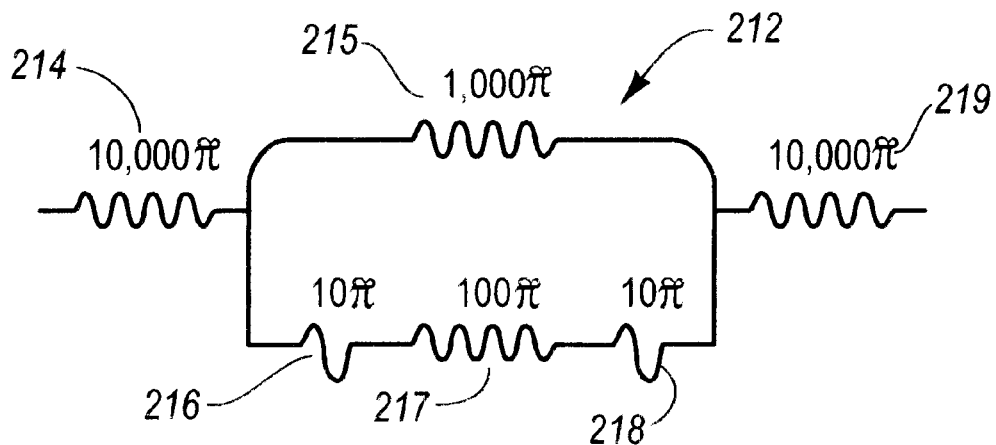
Figure 2B:
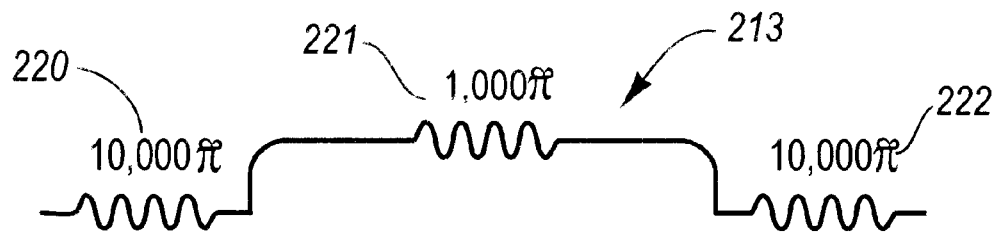

FIGS. 2a and 2b are diagrams showing equivalent electric and magnetic circuits. FIG. 2a shows electrical circuits 201, 202. The first circuit 201 is a parallel circuit having three resistors 205, 206, 207 in series, with a combined resistance of 120 ohms. The combined 120-ohm resistance 205,206, 207 is in parallel with a 1000-ohm resistor 204, making an effective resistance of 107.14 ohms. Two other 10000-ohm resistances 203, 208 are shown in series making a total resistance of 20,107.14 ohms. A series circuit 202 comprising a first resister 209 in series with a second resistor 210 in series with a third resistor 211, having a total resistance of 21000 ohms is shown. FIG. 2b shows representative magnetic circuits 212, 213. The first circuit 212 is a parallel circuit having three reluctances 216, 217, 218 in series, with a combined reluctance of 120 gilberts per Maxwell. The combined reluctance 216, 217, 218 is in parallel with a 1000 gilberts per Maxwell 215, making an effective reluctance of 107.14 gilberts per Maxwell. Two other reluctances 214, 219 are shown in series making a total reluctance of 20,107.14 gilberts per Maxwell. A series circuit 213 comprising three reluctances of 10000 gilberts per Maxwell 220, 1000 gilberts per Maxwell, and 10000 gilberts per Maxwell 222, having a total reluctance of 21000 gilberts/Maxwell is shown. The magnetic circuits shown in this figure are schematic approximations of the magnetic circuits as they occur in the well casing. These magnetic circuits are further explained in FIGS. 3a and 3b.

Figure 3A:
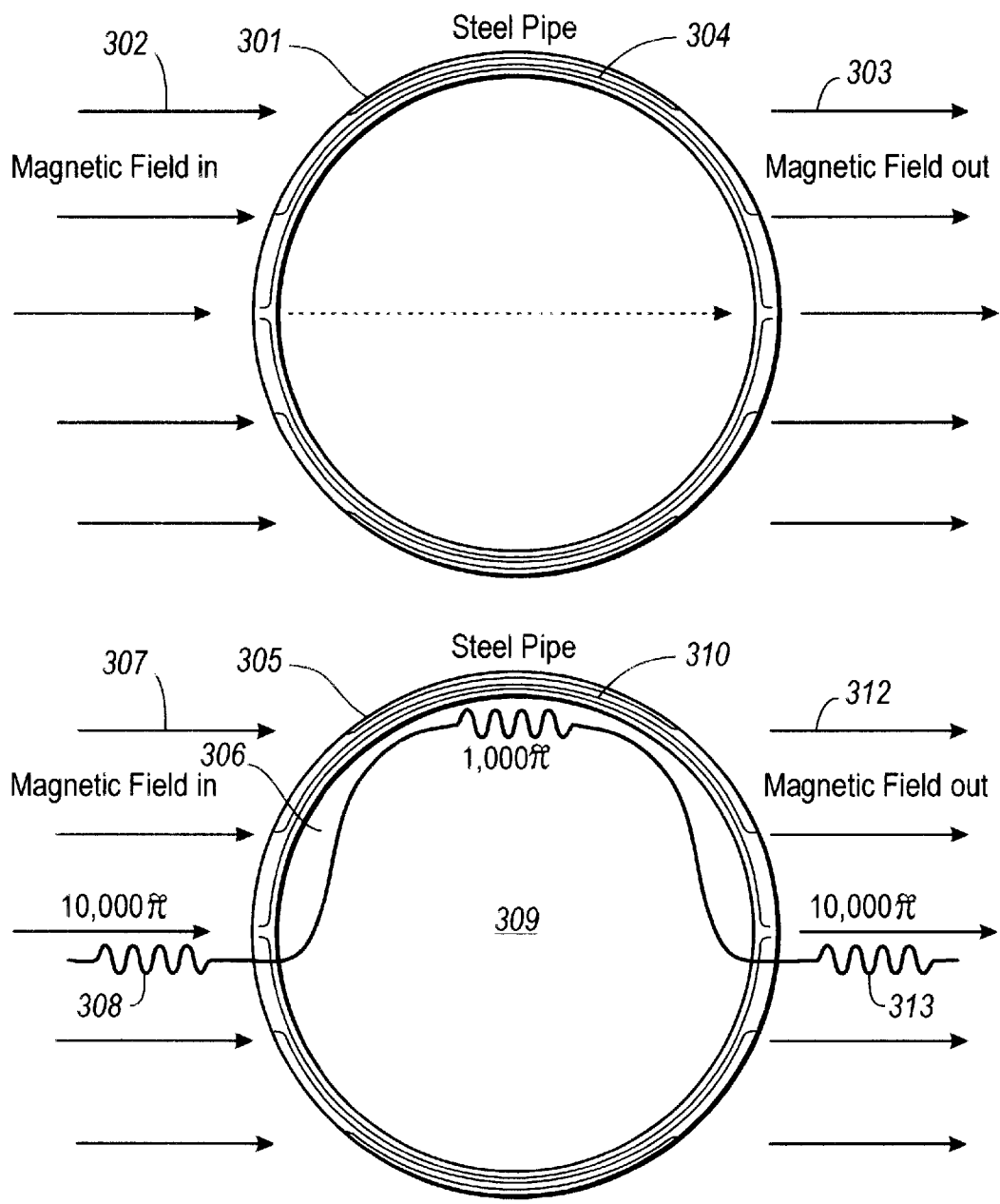
FIG. 3a is a representative view of a well casing in a magnetic field with the equivalent magnetic circuit.

FIG. 3a is a representative view of a well casing in a magnetic field with the equivalent magnetic circuit. The upper steel pipe 301 shows a well casing being impinged upon by a magnetic field in 302 with a magnetic field out 303 of the well casing. The magnetic field 304 of this upper steel pipe 301 is confined to the walls of the steel pipe because of the high permeability of the steel. The magnetic flux inside the pipe 304 is almost nonexistent because the permeability of the material inside the pipe is much lower than the permeability of the steel in the pipe 301. A well casing, similar to that shown in the upper steel pipe 301, is shown below 305 with the equivalent magnetic circuit 306 superimposed thereon. The magnetic field in 307 is represented by a reluctance of 10,000 R 308. The interior surface of the pipe 310 is represented by a reluctance of 1,000 R 311. The magnetic field out 312 of the pipe 310 is represented by a reluctance of 10,000 R 313.

Figure 3B:
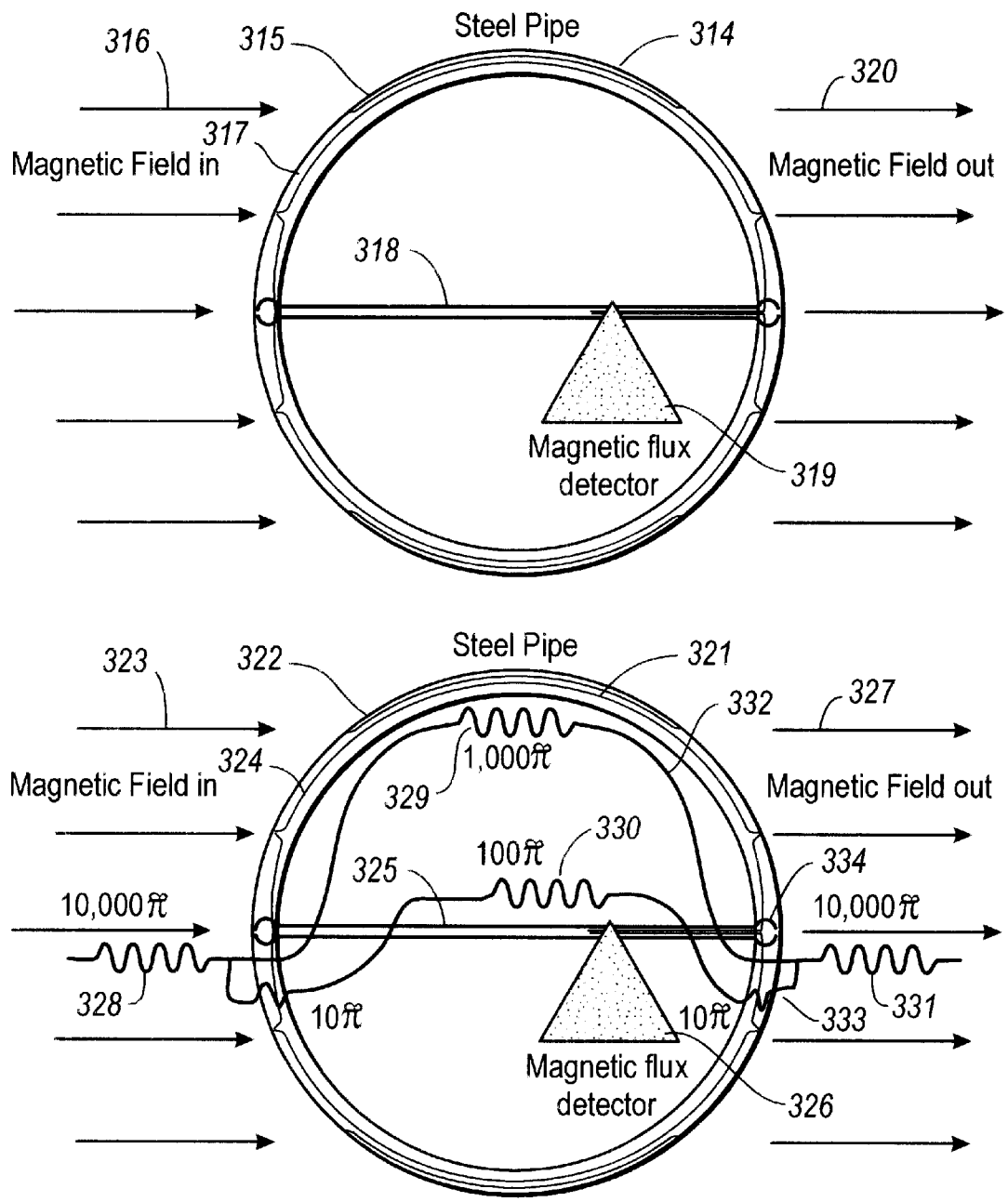
FIG. 3b is a representative view of a well casing in a magnetic field with a. magnetic shunt and the equivalent magnetic circuit.

FIG. 3b is a representative view of a well casing in a magnetic field with a magnetic shunt and the equivalent magnetic circuit. The upper pipe 315 shows a steel well casing 314 with a magnetic filed in 316, a magnetic field 317 is impinged on the pipe 315. A high permeability shunt 318 with a magnetic flux detector 319 are provided inside the pipe 315. A magnetic field output 320 from the well casing 314 is shown in representative form. The lower view of this figure shows a similar well casing with an equivalent magnetic circuit 332 superimposed thereon. The magnetic field in 323 is represented by a reluctance of 10,000 R 328. The field 324 within the steel pipe 322 is represented by a reluctance of 1,000 R 329. The high permeability shunt 325 is represented by a reluctance of 100 R 330. The narrow section 334 of the well casing 321 is represented by a reluctance of 10 R 333. The magnetic filed out 327 is represented by a reluctance of 10,000 R 331. The parallel magnetic circuit 332 of this figure has the same magnetic properties as the well casing 321. The magnetic circuit 332 of FIG. 3b measures the magnetic fields outside 323, 327 the iron or encircling ferromagnetic container 322, such as a steel well casing 321, from inside the same ferromagnetic container 322. The field measured is different from that which is obtained using only an electromagnetic field. The electromagnetic field is subject to skin depth limitation and thus the lower the frequency the better the signal to noise ratio of the sensed signal. By using a magnetic circuit 332 a higher frequency can be used and provides a strong signal for measure.

Figure 4:
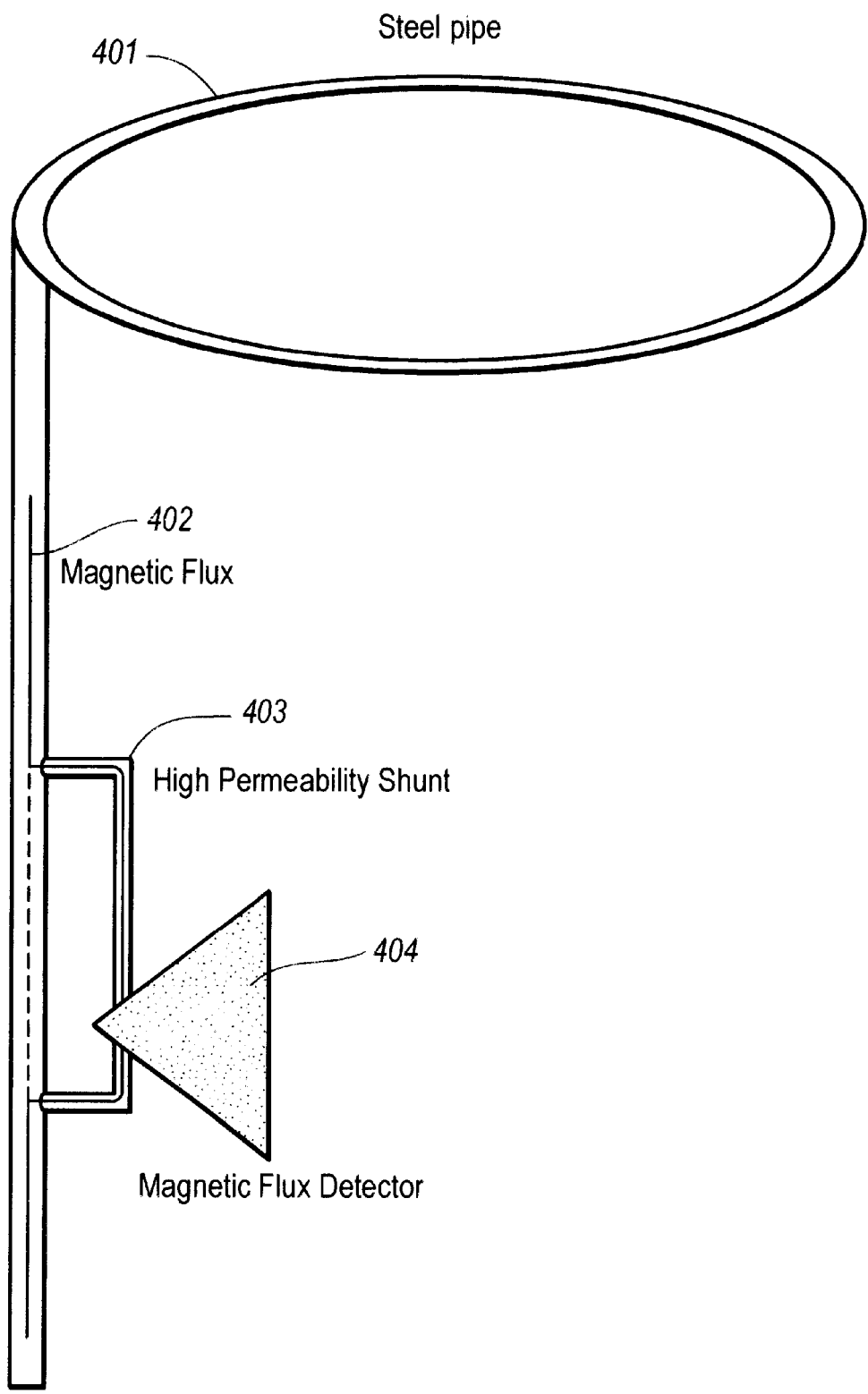
FIG. 4 is a representative view of a well casing using a magnetic circuit to measure the vertical magnetic flux and thereby the vertical magnetic field.

FIG. 4 is a representative view of a well casing using a magnetic circuit to measure the vertical magnetic flux and thereby the vertical magnetic field. The steel pipe 401 of the well casing is shown having magnetic flux 402 moving through the pipe's ferromagnetic material. A high permeability shunt 403 is provided with a shunt detector 404 to measure the magnetic flux 402. The amount of flux 402 moving in the pipe 401 is directly proportional to the strength of the magnetic field it is in. Until the ferromagnetic material of the pipe 401 is saturated, there is a direct correlation between the flux measured and the magnetic field outside the ferromagnetic container 401. In this figure, the vertical magnetic field outside the well casing is measured by the flow of vertical flux 402 inside the well casing. The vertical flux 402 is measured using a vertical magnetic shunt 403 and a magnetic flux detector 404, arranged here in a parallel magnetic circuit.

Figure 5:
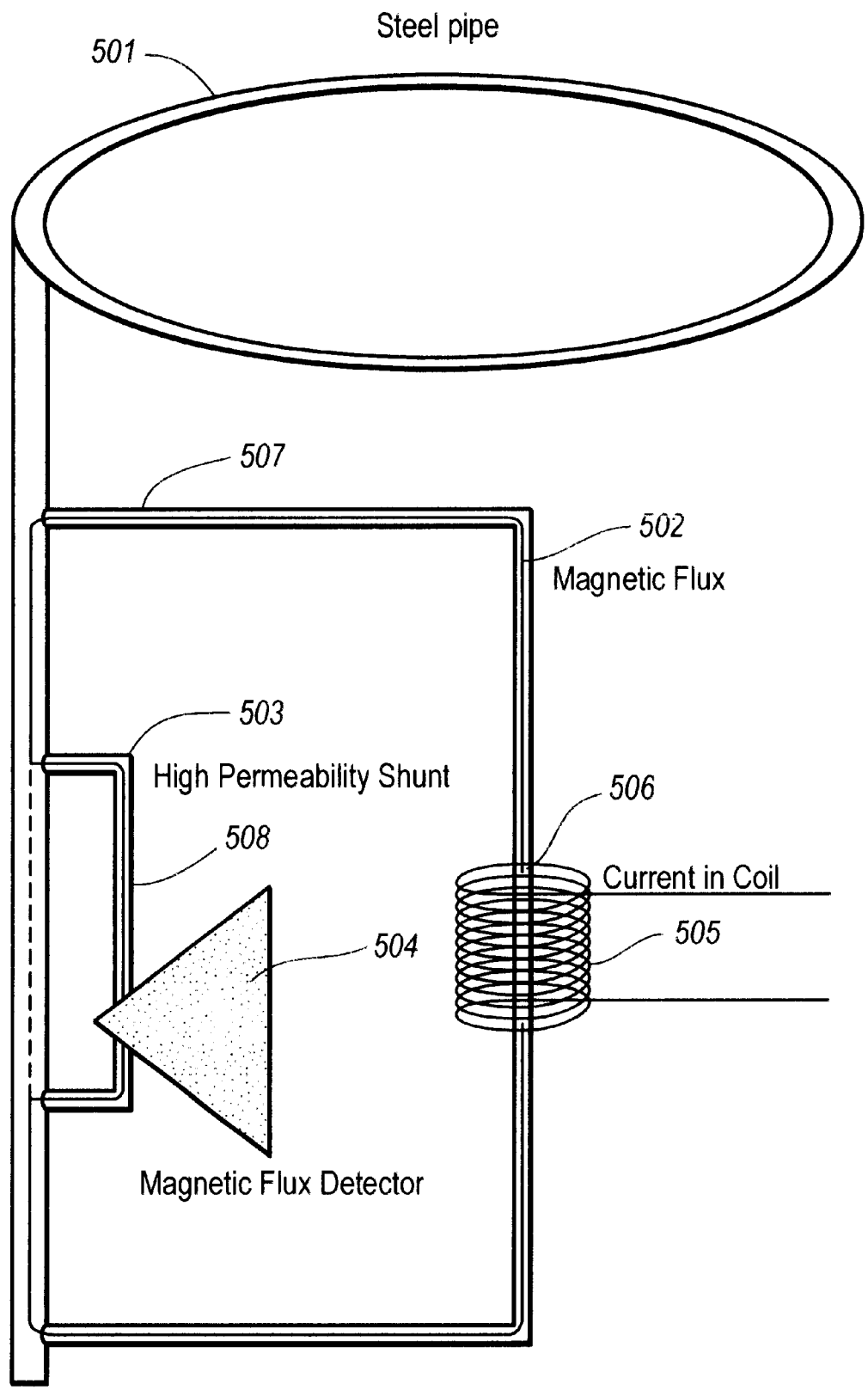
FIG. 5 is a representative view of a well casing having a magnetic bridge circuit to measure the properties of the well casing.

FIG. 5 is a representative view of a well casing having a magnetic bridge circuit to measure the properties of the well casing. This figure shows how the properties of a well casing or magnetic material can be measured by creating a magnetic flux 502 in a pipe 501 using a coil 505 wound around a highly permeable material 506 that is in contact with the well casing 501. This forms a primary magnetic circuit 507 that has properties similar to a toroid. The interior shunt 503 taps off a portion of the magnetic flux 502 flowing in the well casing or pipe 501. By knowing the amount of flux created in the primary circuit 507, the amount of flux flowing in the secondary circuit 508 can be measured, using the magnetic flux detector 504, to determine the properties of the well casing and the formation outside the well casing 501. Unknowns in the measurements can be determined by varying the length of the magnetic circuits.

Figure 6:
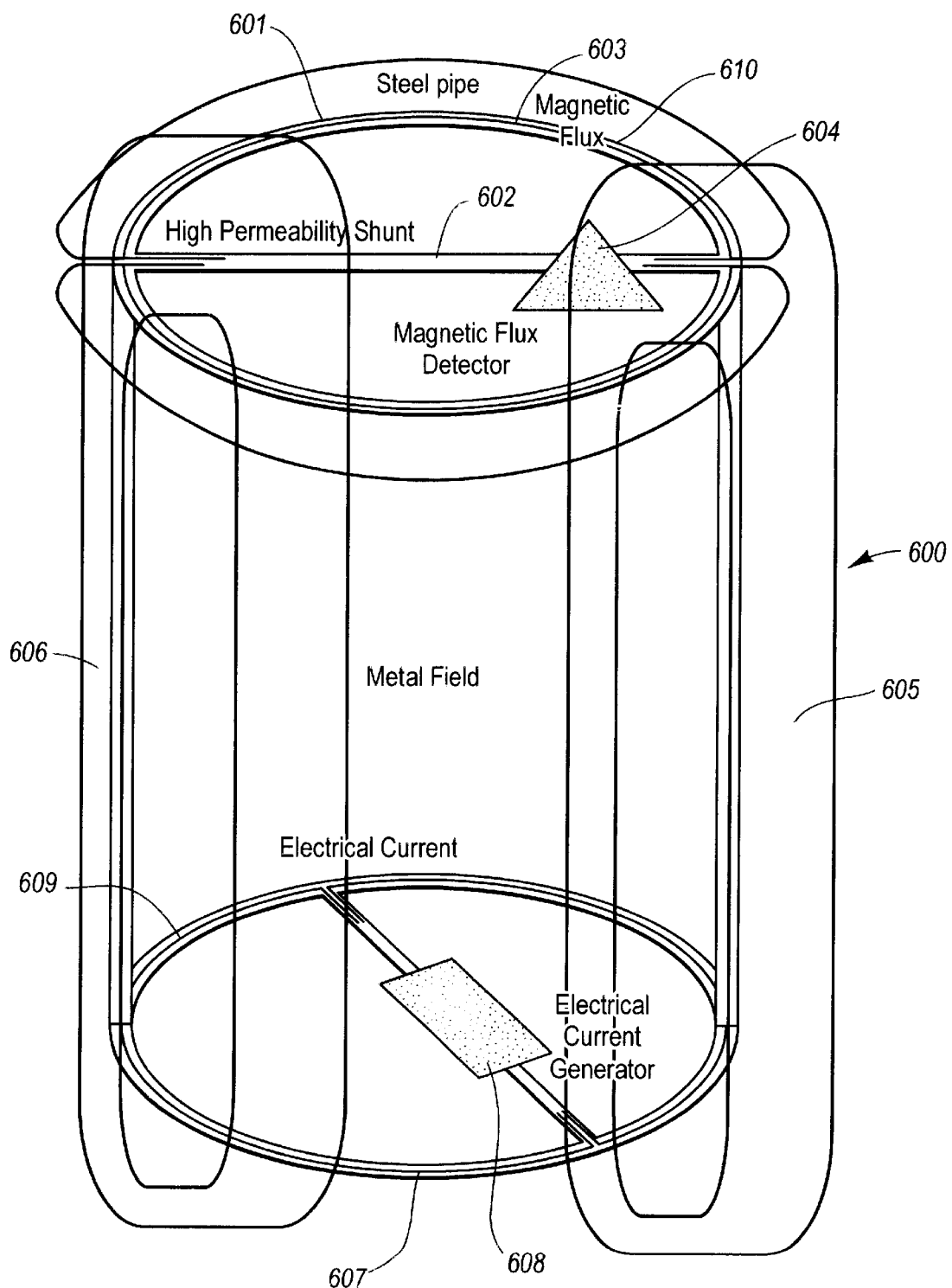
FIG. 6 is a depiction of a magnetic field created using the casing as a part of the electric circuit.

FIG. 6 is a depiction of a magnetic field created using the casing as a part of the electric circuit. A high bridge circuit 600 is shown, in a steel pipe 601, which is composed of both an electrical leg 607 and a magnetic leg 603. The lower part of this bridge circuit 600 is the electric leg 607 and introduces an electrical current 609 that flows in the well casing 601 and the surrounding formations. The electric current 609 flowing in the well casing creates magnetic fields 605, 606. Both the electric current 609 and the magnetic fields 605, 606 interact with the surrounding geologic formations. These interactions perturb the magnetic fields 605, 606, which in turn alter the magnetic flux 603 flowing in the magnetic shunt 601. The magnetic circuit 610 is the magnetic part of the bridge circuit and uses a magnetic flux detector 604 to measure the magnetic flux, as well as irregularities in the magnetic materials.

Figure 7:
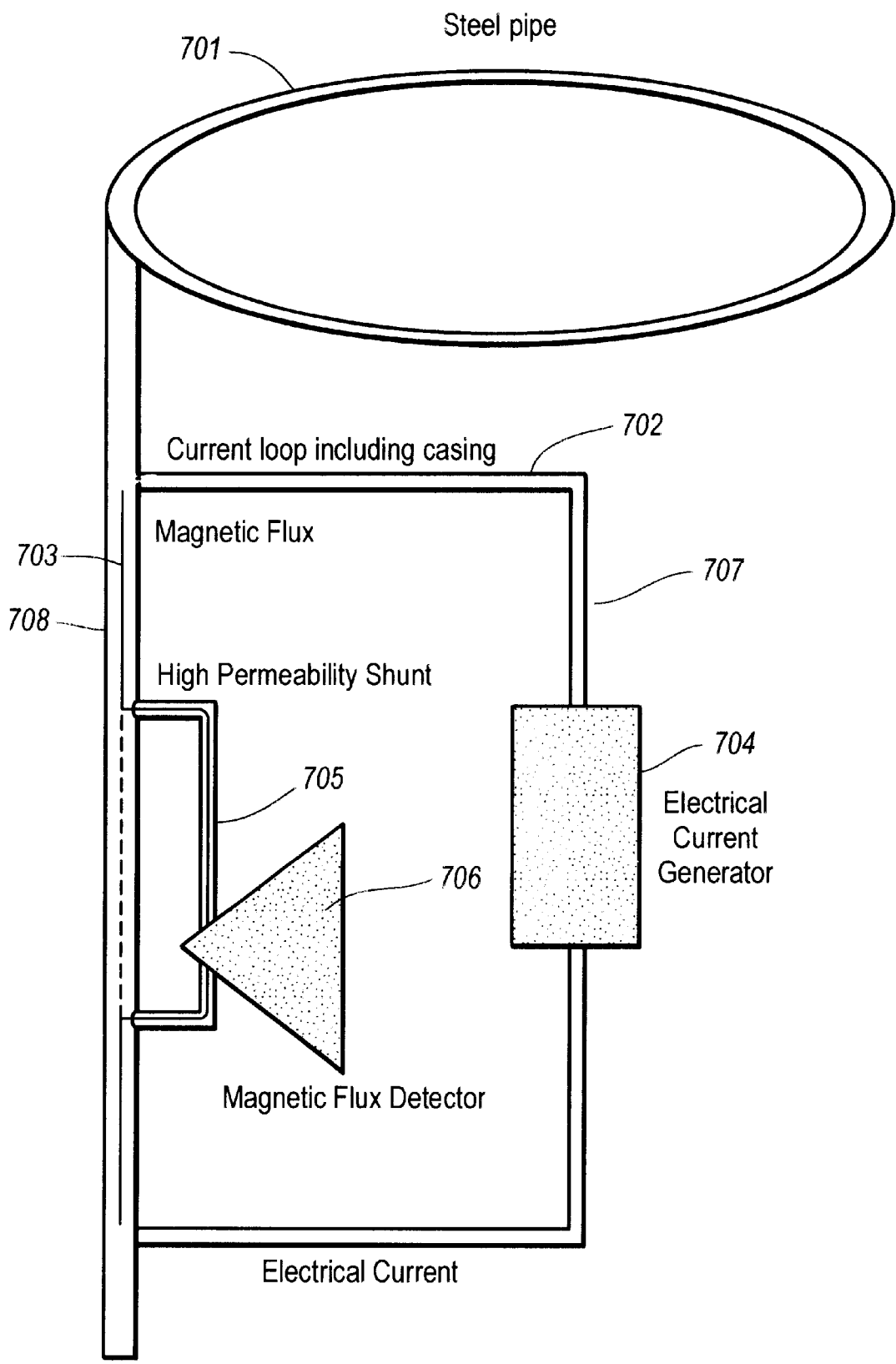
FIG. 7 is a depiction of an electrical circuit and magnetic circuit bridge using a parallel arrangement of the circuits.

FIG. 7 is an alternative depiction of an electrical circuit and magnetic circuit bridge using a parallel arrangement of the circuits. Within the steel pipe 701 are an electrical current generator 704, that has been found experimentally to facilitate performance of this system and which generates an electric current 702. This current branch 707 is in parallel to a magnetic branch 708. The magnetic branch 708 conducts magnetic flux 703 through a high permeability shunt 705 connected on which is a magnetic flux detector 706 for measuring the amount of magnetic flux through the shunt 705. The current 702 flowing through the electric branch 707 creates a magnetic field. In this configuration the primary magnetic field is perpendicular to the magnetic branch 708. This magnetic leg 708 of this bridge measures the irregularities in the magnetic flux flow 703, and thereby measures the irregularities in the surrounding geologic formations.

Figure 8:
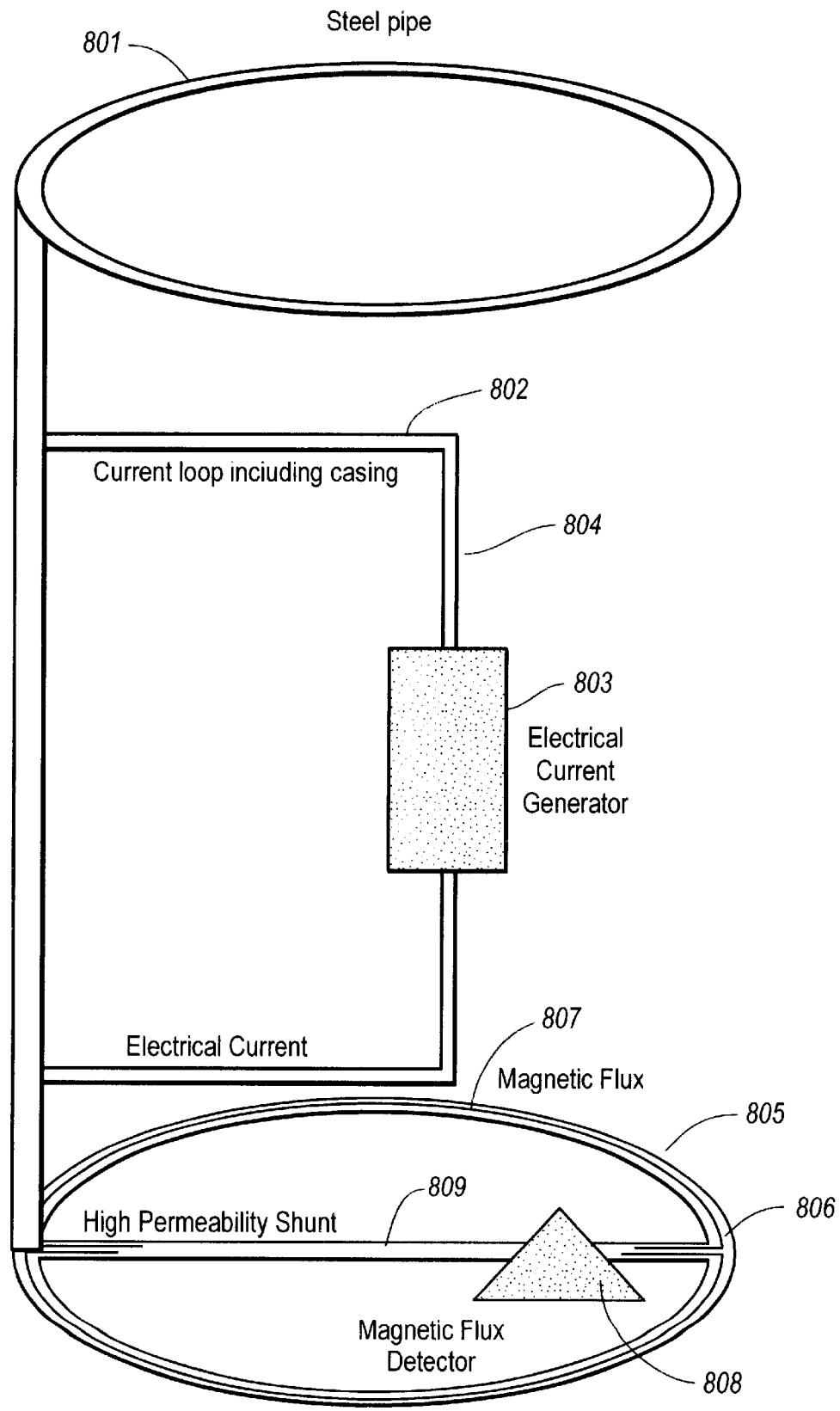
FIG. 8 is a depiction of an electrical circuit and magnetic circuit bridge using perpendicular circuits.

FIG. 8 is a depiction of an electrical circuit and magnetic circuit bridge using perpendicular circuits. This figure shows a hybrid bridge circuit within a steel pipe 801 having both an electrical leg 804 and a magnetic leg 805. The magnetic circuit 805 is rotated ninety degrees from that shown in FIG. 7. In this arrangement the magnetic leg 805 of the bridge circuit measures the magnetic flux 807 within the magnetic conduit 806 created by the electric current 802, which has been shown experimentally to enhance the measurement capability of the system and which is generated by the electrical current generator. A high permeability shunt 809 with a magnetic flux detector 808 is provided in the magnetic circuit 805.

Figure 9:
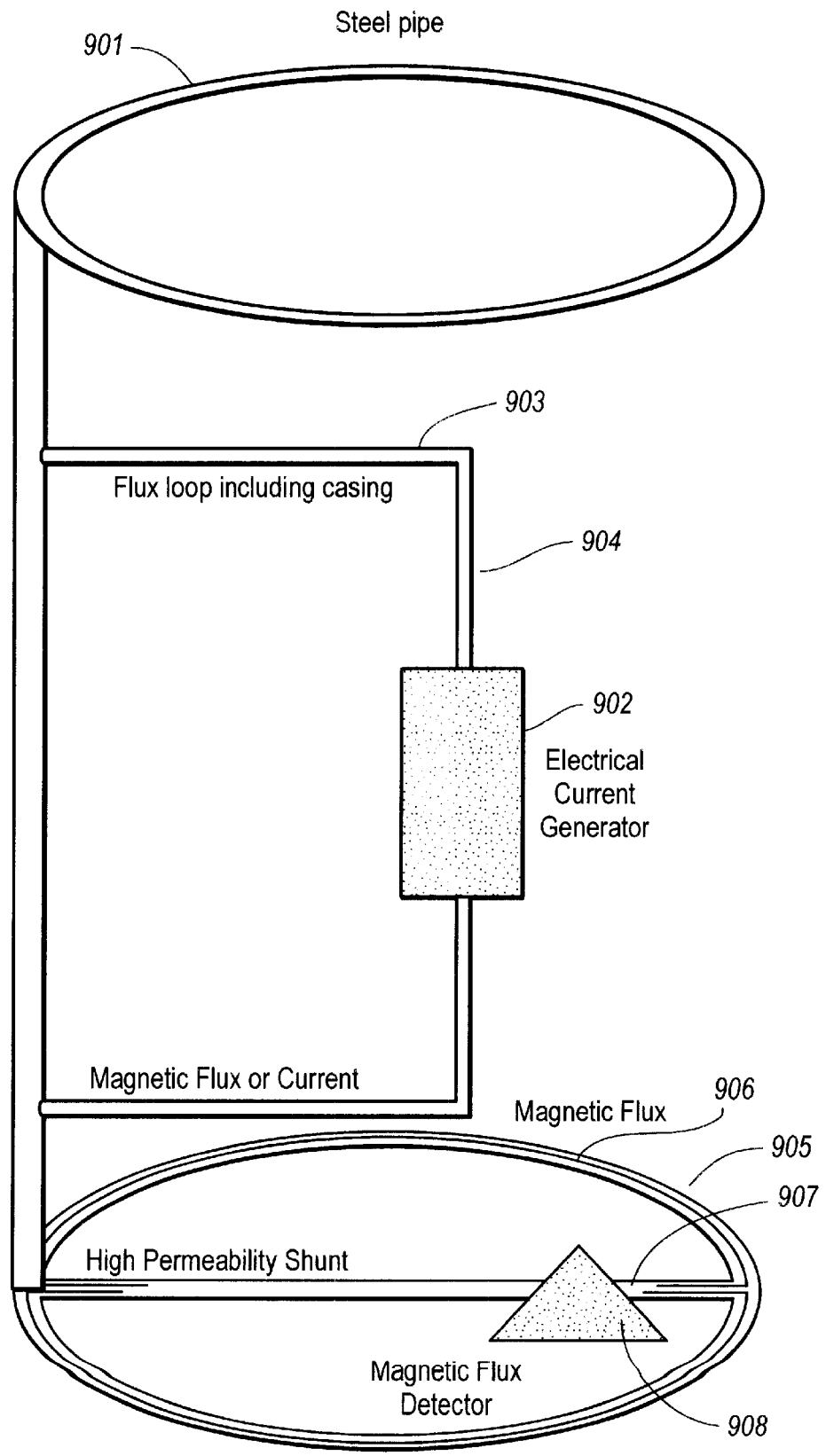
FIG. 9 is a depiction of a magnetic circuit and magnetic circuit bridge using perpendicular circuits.

FIG. 9 is a depiction of a magnetic circuit and magnetic circuit bridge using perpendicular circuits. The bridge of this embodiment has magnetic circuits for both legs 904, 905. The two legs 904, 905 are perpendicular so the magnetic flux 903, 906 measured includes perturbations or irregularities in the surrounding formations. This embodiment has electric current generator 902, which provides the electric current and thereby provides the magnetic flux 903, providing first leg 904. The second leg 905 has a high permeability shunt 907 on which a magnetic flux detector 908 is located to measure the flux in the second leg 905 of the circuit.

In preferred embodiments of this invention one or more of these bridge circuits shown and described in FIGS. 4 through 9 are used together to permit the measurement and analysis of various parameters and formation constants. As the primary objective of this invention is to provide a system and method which can identify formations and measure the electrical and magnetic characteristics of the formation outside a well casing in induction logging.

Figure 10:
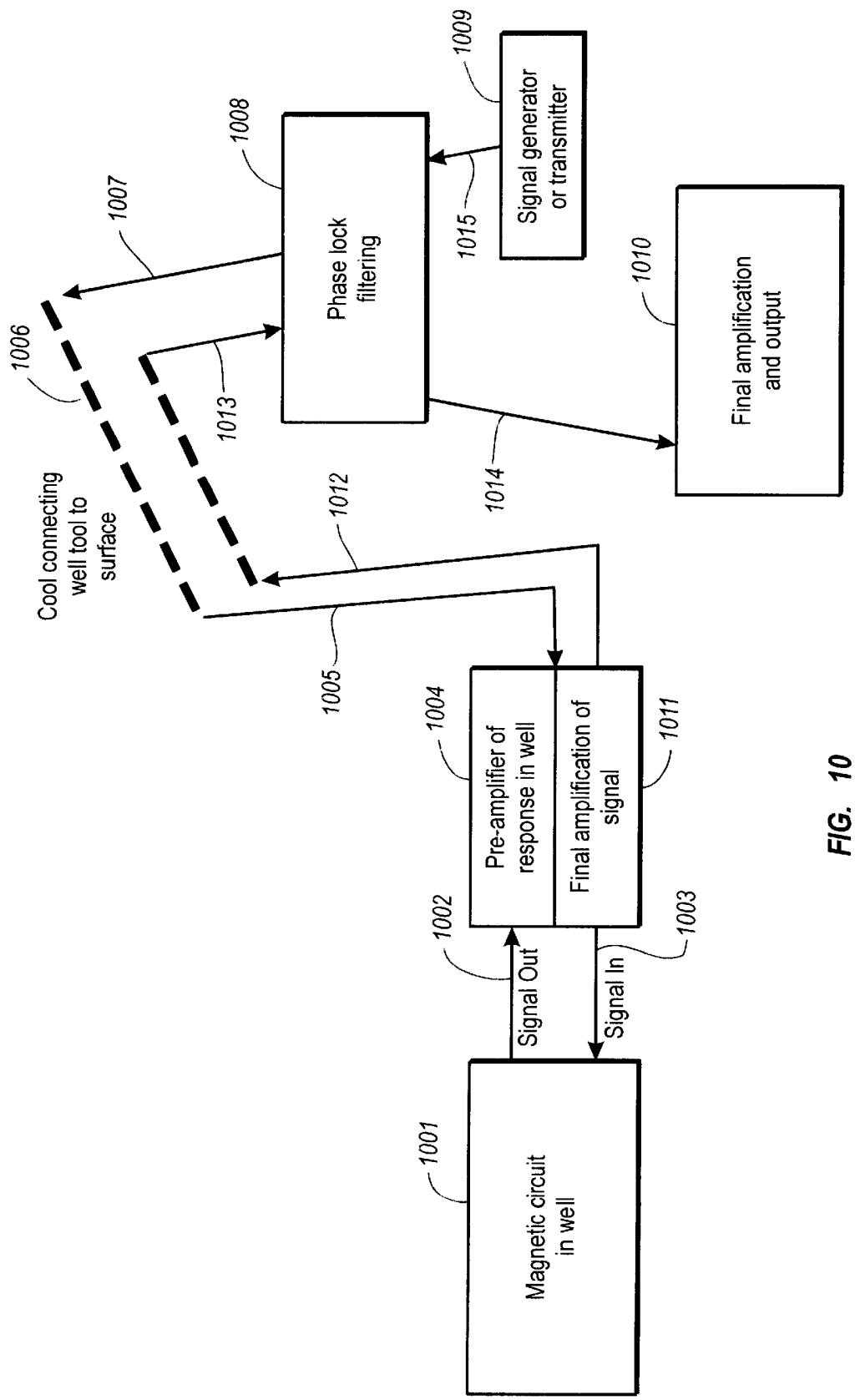
FIG. 10 is a block diagram of the preferred circuit with detectors in a cased well and support electronics on the surface.

FIG. 10 shows a block diagram of a preferred circuit with the deflectors in the cased well and with the support electronics on the surface. A magnetic circuit 1001 is located in the well. A signal 1002 from the magnetic circuit 1001 is connected to a pre-amplifier 1004 for amplification of the signal 1002 from the magnetic circuit 1001. The pre-amplifier 1004 is connected 1005 via a cable 1006 which is also connected 1007 to a phase lock filter 1008. The phase lock filter 108 receives a signal 1015 from a signal generator or transmitter 1009. The phase lock filter 108 also sends a signal 1014 to a final amplifier and output circuit 1010. The phase lock filter 1008 is also connected 1013 via the cable 1006 which in turn is connected 1012 to a source signal amplifier 1011. The source signal amplifier 1011 provides the input signal 1003 to the magnetic circuit 1001 in the well.

The foregoing description is of preferred embodiments of the invention, which may or may not be used together, and has been presented for the purposes of illustration and description of the best mode of the invention currently known to the inventors. It is not intended to be exhaustive or to limit the invention to the precise form, connections, or choice of components disclosed. Modifications and/or variations are possible and foreseeable in light of the above teachings. This embodiment of the invention was chosen and described to provide the best illustration and instruction of the principles of the invention and its practical application to thereby enable one of ordinary skill in the art to utilize the invention in various embodiments and with various modifications as are suited to the particular use contemplated. All such modifications and variations are within the scope of the invention as determined by the appended claims and their equitable equivalents, when they are interpreted in accordance with the breadth to which they are fairly and legally entitled.

We claims:

1. A system for measuring a magnetic field, comprising:
   (A) a ferromagnetic container;
   (B) a magnetic circuit within said ferromagnetic container, said magnetic circuit further comprising a high permeability shunt and a magnetic flux detector; and
   (C) an electric circuit within said ferromagnetic container, wherein said electric circuit is in parallel with said magnetic circuit.
2. A system for measuring a magnetic field, comprising:
   (A) a ferromagnetic container;
   (B) a magnetic circuit within said ferromagnetic container, said magnetic circuit further comprising a high permeability shunt and a magnetic flux detector; and
   (C) an electric circuit within said ferromagnetic container, wherein said electric circuit is in series with said magnetic circuit.
3. A system for measuring a magnetic field, comprising:
   (A) a ferromagnetic container; and
   (B) a magnetic circuit within said ferromagnetic container, said magnetic circuit further comprising a high permeability shunt and a magnetic flux detector and wherein said high permeability shunt is composed of a material selected from the group consisting of mu metal, high silicon transformer steel, permalloy, and supermalloy.

* * * * *